United States Patent
Finn

(10) Patent No.: US 10,044,358 B2
(45) Date of Patent: Aug. 7, 2018

(54) LOOP FILTER WITH ACTIVE DISCRETE-LEVEL LOOP FILTER CAPACITOR IN A VOLTAGE CONTROLLED OSCILLATOR

(71) Applicant: TEXAS INSTRUMENTS INCORPORATED, Dallas, TX (US)

(72) Inventor: Steven Ernest Finn, Atlanta, GA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 49 days.

(21) Appl. No.: 15/385,859

(22) Filed: Dec. 20, 2016

(65) Prior Publication Data

US 2017/0179965 A1    Jun. 22, 2017

Related U.S. Application Data

(60) Provisional application No. 62/270,515, filed on Dec. 21, 2015.

(51) Int. Cl.
| | |
|---|---|
| H02J 9/02 | (2006.01) |
| H03L 7/089 | (2006.01) |
| H03L 7/08 | (2006.01) |
| H03L 7/099 | (2006.01) |

(52) U.S. Cl.
CPC .......... *H03L 7/0891* (2013.01); *H03L 7/0807* (2013.01); *H03L 7/099* (2013.01)

(58) Field of Classification Search
CPC ..................................................... H03L 7/0891
See application file for complete search history.

(56) References Cited

U.S. PATENT DOCUMENTS

| | | |
|---|---|---|
| 6,753,738 B1 | 6/2004 | Baird |
| 7,583,151 B2 | 9/2009 | Fan et al. |
| 8,154,351 B2 | 4/2012 | Shahrzadtadjpour |
| 8,188,798 B1 | 5/2012 | Leung et al. |

(Continued)

FOREIGN PATENT DOCUMENTS

EP            1422822 A2    5/2004

OTHER PUBLICATIONS

PCT Search Report for Application No. PCT/US 2016/068132, dated Apr. 20, 2017.

*Primary Examiner* — Daniel Puentes
(74) *Attorney, Agent, or Firm* — Andrew Viger; Charles A. Brill; Frank D. Cimino

(57) ABSTRACT

A loop filter with an active discrete-level loop filter capacitor can be used in a VCO (such as for CDR). A loop filter capacitor function is simulated by sensing input loop filter current (such as with a current mirror and source follower in the input leg), and forcing back a loop filter (VCO) control voltage. Loop filter voltage control is provided using a VDAC with a discrete-level VDAC feedback voltage, incremented/decremented based on the sensed loop filter current. In one embodiment, the VDAC voltage is provided as the non-inverting input to an amplifier, with the inverting input providing the control voltage, forced to the VDAC feedback voltage. The VDAC feedback voltage can be provided by increment/decrement comparators based on a voltage deviation on a C2 capacitor (from a reference voltage) that receives the sensed loop filter current (effectively multiplying the C2 capacitance to provide a simulated loop filter capacitance).

21 Claims, 3 Drawing Sheets

(56) References Cited

U.S. PATENT DOCUMENTS

| | | |
|---|---|---|
| 8,278,984 B2 | 10/2012 | Lamanna et al. |
| 8,781,046 B2 | 7/2014 | Guillot |
| 2007/0173219 A1* | 7/2007 | Kim ........................ H03L 7/099 |
| | | 455/260 |

* cited by examiner

LOOP FILTER WITH ACTIVE DISCRETE-LEVEL LOOP FILTER CAPACITOR IN A VOLTAGE CONTROLLED OSCILLATOR

CROSS-REFERENCE TO RELATED APPLICATIONS

Priority is claimed under 37 CFR 1.78 and 35 USC 119(e) to U.S. Provisional Application 62/270,515, filed 21 Dec. 2015, which is incorporated by reference.

BACKGROUND

Technical Field

This patent Disclosure relates generally to filter circuits, and more particularly to loop filter circuits used in phase-locked loop (PLL) circuits such as for clock data recovery.

Related Art

Analog phase-locked loop control systems include a VCO (voltage or current controlled oscillator) with a frequency/phase control loop including a phase (or phase/frequency) detector PD/PFD, and a loop filter. The PD/PFD compares the phase of an input signal and a VCO feedback signal, and generates an phase error output, which is low pass filtered by the loop filter to provide a VCO control voltage to phase lock the VCO output signal with the input signal.

FIG. 1 illustrates a PLL 10 with a VCO 12 and a phase/frequency detector (PFD) 14, and an example charge pump loop filter 20 driven by the PFD. Loop filter 20 includes a loop filter capacitor C1, and an optional secondary filter (smoothing) capacitor C2. Loop filter 20 low pass filters the PDF phase error output to provide a VCO control voltage V1.

One application of phase-locked loop control systems is for clock data recovery. In an integrated CDR, the loop filter capacitor can use 25% or more of the die area. Alternative design approaches to reducing this die area penalty are to use an external loop filter cap, or to replace an analog PLL/CDR design with a digital PLL/CDR.

While this Background information references CDR circuits, the Disclosure is more generally directed to filter circuits for PLL systems.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for a loop filter with an active discrete-level loop filter capacitor, such as for use in a voltage controlled oscillator, such as for clock data recovery.

According to aspects of the Disclosure, the loop filter capacitor function is simulated by: (a) sensing an input loop filter current, and providing a corresponding sensed loop filter current; and (b) providing a VCO control voltage by generating a discrete-level VDAC feedback voltage that is incremented and decremented based on the sensed loop filter current, generating a VDAC control voltage using a VDAC (voltage digital to analog converter) based on the discrete-level VDAC feedback voltage, providing the VDAC control voltage to a non-inverting input to an amplifier, and generating the VCO control voltage at a loop filter output node coupled to an inverting input to the amplifier, the VCO control voltage based on the VDAC feedback voltage, which is based on the sensed loop filter current.

According to other aspects of the Disclosure, the discrete-level VDAC feedback voltage can be generated by: incrementing and decrementing the VDAC feedback voltage based on a deviation of a voltage V2 on C2 from a voltage reference Vref based in the sensed loop filter current; and resetting the V2 voltage on C2 to Vref after each increment and decrement of the VDAC feedback voltage; such that an effective loop filter capacitance of the loop filter circuitry is a multiplication of a capacitance of C2. According to other aspects of the Disclosure, the input loop filter current is sensed using: a current mirror with a mirror input leg including a mirror input node coupled to receive the input loop filter current, and a mirror output leg including a mirror output node to provide the sensed loop filter current, the mirror output node coupled to the VDAC feedback circuitry; and a source follower transistor included in the mirror input leg, and controlled by the VDAC circuitry to sense the input loop filter current, which is mirrored as the sensed loop filter current to the mirror output leg based on a pre-defined mirror-ratio.

Other aspects and features of the invention claimed in this Patent Document will be apparent to those skilled in the art from the following Disclosure.

DETAILED DESCRIPTION

This Description and the Drawings constitute a Disclosure for a loop filter with active discrete-level loop filter capacitor, including describing example embodiments, and illustrating various technical features and advantages. An example application is a loop filter for VCOs (voltage or current controlled oscillators), such as for clock data recovery systems.

Figure 1:
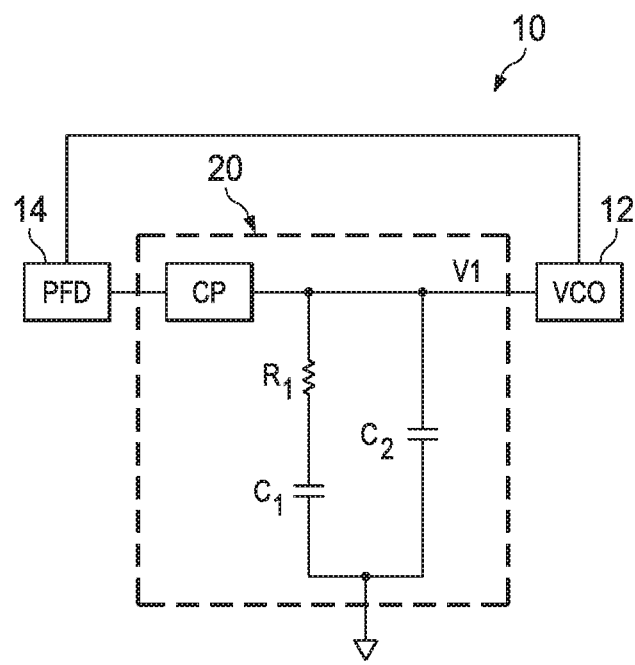
FIG. 1 illustrates a PLL [10] with a VCO [12] and phase/frequency detector [PFD 14], and an example charge pump loop filter [20], including a loop filter capacitor [C1].

The terminology active discrete-level loop filter "capacitor" means an active circuit design for loop filter capacitance function that can be used to replace a component capacitor, such as illustrated in FIG. 1, C1].

In brief overview a loop filter with an active discrete-level loop filter capacitor can be used in a VCO (such as for CDR). A loop filter capacitor function is simulated by sensing input loop filter current (such as with a current mirror and source follower in the input leg), and forcing back a loop filter (VCO) control voltage. Loop filter voltage control is provided using a VDAC with a discrete-level VDAC feedback voltage, incremented/decremented based on the sensed loop filter current. In one embodiment, the VDAC voltage is provided as the non-inverting input to an amplifier, with the inverting input providing the control voltage, forced to the VDAC feedback voltage. The VDAC feedback voltage can be provided by increment/decrement comparators based on a voltage deviation on a C2 capacitor (from a reference voltage) that receives the sensed loop filter current (effectively multiplying the C2 capacitance to provide a simulated loop filter capacitance).

Figure 2:
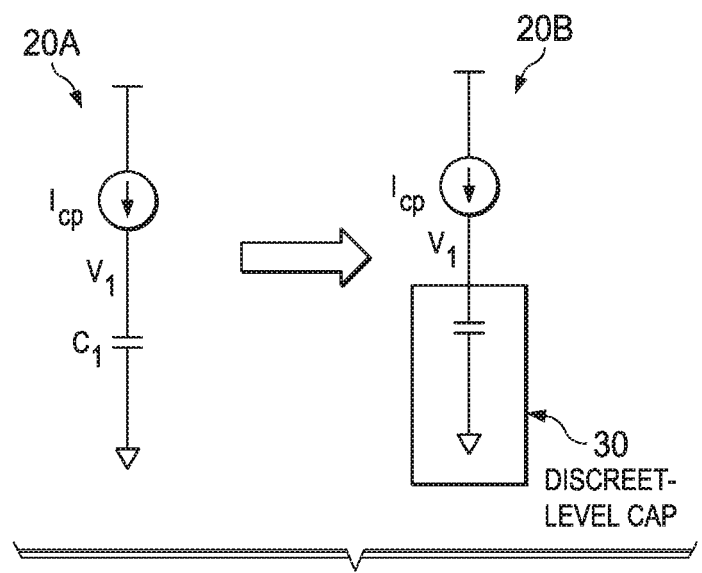
FIG. 2 is a functional illustration of replacing a loop filter capacitor [C1] with an active discrete-level loop filter capacitor [30] according to this Disclosure.

FIG. 2 is a functional illustration of replacing a component loop filter capacitor C1 with an active discrete-level loop filter capacitor [30] according to this Disclosure.

As noted above, as used in this Disclosure, the terminology active discrete-level loop filter "capacitor" means an active circuit design for loop filter capacitance function that can be used to replace a component capacitor, as described in connection with FIGS. 3 and 4. That is, the active loop filter capacitor design creates, in effect a "pseudo" capacitor that provides the loop capacitor functionality, as an alternative analog capacitor design, without adopting a full digital loop filter.

Figure 3:
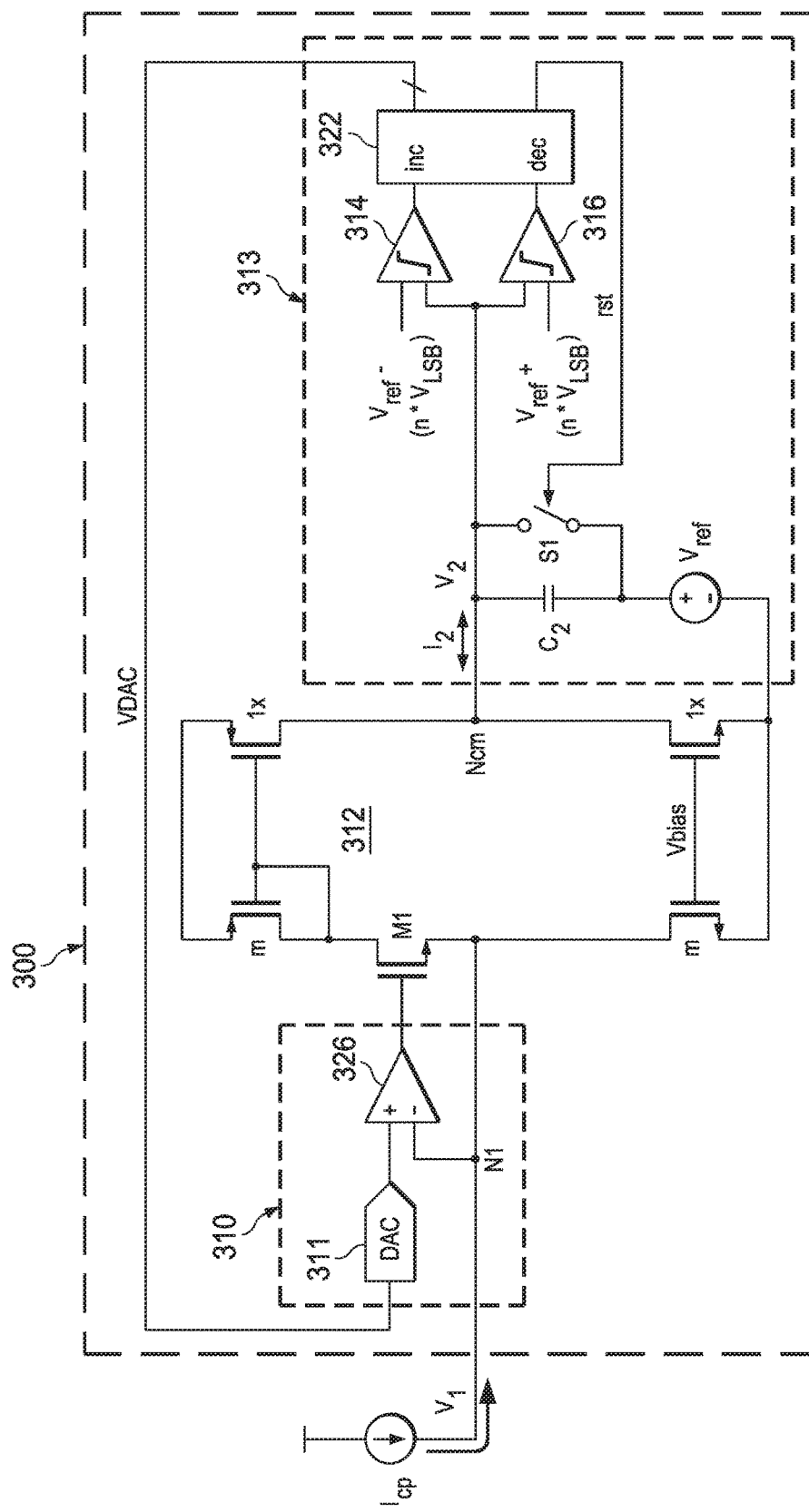
FIG. 3 illustrates an example embodiment of a loop filter with an active discrete-level loop filter capacitor [300] for replacing a component loop filter capacitor [FIG. 1, C1], using VDAC circuitry [310, 311] to approximate the loop filter capacitor function, including sensing [312] input loop filter current (Icp), and forcing back [313, 310] the appropriate VCO control voltage [V1] generated by the VDAC circuitry [311, 326 at N1].

FIG. 3 illustrates an example embodiment of a loop filter with an active discrete-level loop filter capacitor 300. The active discrete-level loop filter capacitor design uses VDAC (voltage digital-to-analog converter) voltage control circuitry 310, 311, 313 to approximate the loop filter capacitor function.

The loop filter capacitor function is simulated by sensing (312) input loop filter current Icp received at an input node N1, and forcing back the appropriate VCO control voltage V1 at node N1 with the VDAC voltage control circuitry. The VDAC voltage control circuitry includes VDAC circuitry 310, including a VDAC 311, and VDAC feedback circuitry 313.

Current sense circuitry 312 senses input loop filter current Icp (received through N1), and provides a corresponding sensed loop filter current I2. Current sense circuitry includes a current mirror with a source follower NMOS M1 in the mirror input leg.

The current mirror includes an input leg coupled to node N1, and a mirror (output) leg with an output node Ncm. Source follower M1 in the current mirror input leg is source-coupled to node N1, receiving the input loop filter current Icp.

The low-output impedance source follower M1 is controlled by the VDAC circuitry as described below. Source follower M1 senses the input loop filter current Icp at its drain, which is mirrored to the mirror output leg (based on a pre-defined mirror ratio, for example 10:1), and output through Ncm as the sensed loop filter current I2.

The VDAC voltage control circuitry 310, 313 generates the VCO control voltage V1 (N1) based on a VDAC feedback voltage, which is based on the sensed loop filter current generated by current sense circuitry 312. VDAC voltage control circuitry includes VDAC circuitry 310, including VDAC 311, and VDAC feedback circuitry 313.

VDAC feedback circuitry 313 generates a discrete-level VDAC feedback voltage that is incremented and decremented based on the sensed loop filter current, and input to the VDAC 311.

VDAC feedback circuitry 313 includes increment and decrement comparators 314 and 316 responsive to a voltage based on the sensed loop filter current I2 output from current sense circuitry 312 at the mirror output node Ncm. Increment/decrement comparators respectively generate increment/decrement signals input to INC/DEC logic 322. INC/DEC logic 322 is responsive to the increment/decrement signals from comparators 314/316 to generate the discrete-level VDAC feedback voltage.

VDAC feedback circuitry includes a capacitor C2 coupled between the current mirror output node Ncm, and a reference voltage Vref. The increment/decrement comparators generate the increment/decrement signals based on a deviation of a voltage V2 on C2 from Vref. INC/DEC logic 322 provides a reset signal to switch S1 to reset V2 to Vref after each increment and decrement signal. Effectively, the loop filter capacitance of the loop filter circuitry 300 is a multiplication of the capacitance of C2.

VDAC circuitry 310 includes an amplifier 326 to provide a control input to the source follower M1 in current sense circuitry (current mirror) 322. Amplifier 326 has a noninverting input coupled to receive the VDAC feedback voltage, and an inverting input coupled to node N1, the VCO control voltage V1. Amplifier 326 forces the VCO control voltage V1 at the inverting input to be substantially equal to the VDAC feedback voltage at the non-inverting input.

Thus, the low-output impedance provided by source follower M1 (1/(Av*gm)) at the input node N1 effectively provides a "pseudo" loop filter capacitor. The capacitor function simulated by the VDAC voltage control function, including VDAC 311 and amplifier 326 providing a control voltage to source follower M1. Loop filter input current Icp is sensed by the source follower M1, and mirrored to provide the sensed loop filter current I2 output from Ncm. The sensed loop filter current I2 is applied across the secondary capacitor C2 (for example, approximately 1 pF). Increment/decrement comparators 314/316 sense the deviation of V2 relative to Vref, and provide corresponding increment/decrement signals to the INC/DEC logic 322. When a positive edge of the increment/decrement signals is sensed, the INC/DEC control logic increments/decrements by 1×LSB (for example, approximately 1 mV) the VDAC feedback voltage controlling the VCO control voltage V1.

The loop filter with an active discrete-level loop filter capacitor 300 effectively provides capacitance multiplication of C2 by two factors: (a) n=$V_{trig}/V_{LSB}$ where $V_{trig}$ is the delta voltage accumulated on the small capacitor $C_2$; and (b) the current mirror ration m. An example value of $C_2$ 1 pF yields approximately 1000× reduction from 1 nF (a representative value for a component loop filter capacitor):

$$I_{cp} = C_1 \frac{dV_1}{dt} \Rightarrow \left(\frac{I_{cp}}{m}\right) = \left(\frac{C_1}{n \cdot m}\right) \frac{n \cdot dV_1}{dt} \Rightarrow I_2 = C_2 \frac{dV_2}{dt}$$

Figure 4:
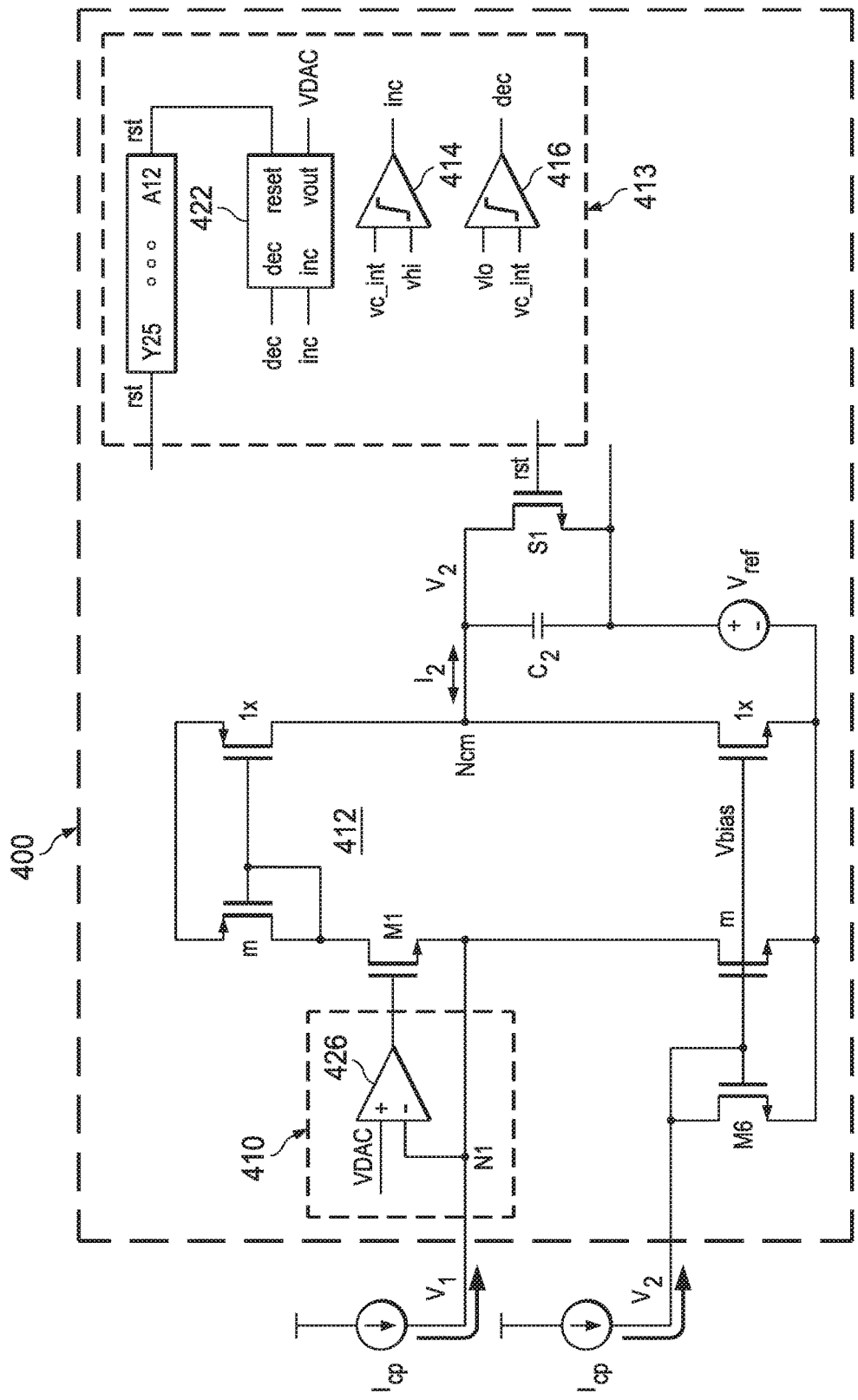
FIG. 4 illustrates an example implementation of a loop filter with an active discrete-level loop filter capacitor [400], including VDAC circuitry [410], current sense circuitry [412], VDAC feedback circuitry [413].

FIG. 4 illustrates an example implementation of a loop filter with an active discrete-level loop filter capacitor 400, including VDAC circuitry 410, current sense circuitry 412 and VDAC feedback circuitry 413. VDAC feedback circuitry 413 is shown deconstructed as comparators 414, 416, and INC/DEC control logic 422, together generating the VDAC feedback voltage.

The loop filter with an active discrete-level loop filter capacitor according to this disclosure can be designed as a un-clocked digital block that is low power and low current consumption (for example, approximately 1 mA total). It is based on a VDAC VCO voltage control architecture including approximately a 10 bit VDAC, inc/dec comparators, and a current-mirror. For an example CDR application with integrated loop filter capacitor, die area is significantly reduced.

In summary, a loop filter, such as for use in a VCO, is based on an active discrete-level loop filter capacitor that includes: current sense circuitry to sense an input loop filter current, and provide a corresponding sensed loop filter current; and VDAC voltage control circuitry. The VDAC control circuitry includes: VDAC circuitry including a VDAC (voltage digital-to-analog converter), and VDAC feedback circuity to generate a discrete-level VDAC feedback voltage that is incremented and decremented based on the sensed loop filter current; the VDAC circuitry to generate the VCO control voltage based on the VDAC feedback voltage, which is based on the sensed loop filter current. The VDAC circuitry can include an amplifier to provide a control input to the current sense circuitry; the amplifier having a noninverting input coupled to receive the VDAC feedback voltage, and an inverting input coupled to the VCO control voltage; such that the VCO control voltage is substantially equal to the VDAC feedback voltage. The VDAC feedback circuitry can include increment and decrement comparators responsive to a voltage based on the sensed loop filter current to respectively generate increment and decrement signals; and inc/dec logic responsive to the increment and decrement signals to generate the discrete-level VDAC feedback voltage. The VDAC feedback circuitry can further include: a capacitor C2 coupled between the output node, and a reference voltage Vref; the increment and decrement comparators to generate the increment and decrement signals based on a deviation of a voltage V2 on C2 from Vref; and reset circuitry coupled to C2 and responsive to a reset signal from the inc/dec logic to reset V2 to Vref after each increment and decrement signal; such that an effective loop filter capacitance of the loop filter circuitry is a multiplication of a capacitance of C2. The current sense circuitry can include: a current mirror with a mirror input leg including a mirror input node coupled to receive the input loop filter current, and a mirror output leg including a mirror output node to provide the sensed loop filter current, the mirror output node coupled to the VDAC feedback circuitry; and a source follower transistor included in the mirror input leg, and controlled by the VDAC circuitry to sense the input loop filter current, which is mirrored as the sensed loop filter current to the mirror output leg based on a pre-defined mirror-ratio.

The Disclosure provided by this Description and the Figures sets forth example embodiments and applications illustrating aspects and features of the invention, and does not limit the scope of the invention, which is defined by the claims. Known circuits, connections, functions and operations are not described in detail to avoid obscuring the principles and features of the invention. These example embodiments and applications, including example design considerations/choices/tradeoffs, can be used by ordinarily skilled artisans as a basis for modifications, substitutions and alternatives to construct other embodiments, including adaptations for other applications.

The invention claimed is:

1. A circuit, comprising
    a VCO (voltage controlled oscillator); and
    loop filter circuitry to provide a low-pass filtered VCO control voltage to the VCO, including
        current sense circuitry to sense an input loop filter current, and provide a corresponding sensed loop filter current; and
        VDAC voltage control circuitry, including
            VDAC circuitry including a VDAC (voltage digital-to-analog converter), and
            VDAC feedback circuity to generate a discrete-level VDAC feedback voltage that is incremented and decremented based on the sensed loop filter current;
            the VDAC circuitry to generate the VCO control voltage based on the VDAC feedback voltage, which is based on the sensed loop filter current.

2. The circuit of claim 1, wherein the VDAC circuitry comprises
    an amplifier to provide a control input to the current sense circuitry;
    the amplifier having
        a noninverting input coupled to receive the VDAC feedback voltage, and
        an inverting input coupled to the VCO control voltage;
        such that the VCO control voltage is substantially equal to the VDAC feedback voltage.

3. The circuit of claim 2, wherein the VDAC feedback circuitry comprises:
    increment and decrement comparators responsive to a voltage based on the sensed loop filter current to respectively generate increment and decrement signals; and
    inc/dec logic responsive to the increment and decrement signals to generate the discrete-level VDAC feedback voltage.

4. The circuit of claim 3, wherein the current sense circuitry outputs the sensed loop filter current at an output node coupled to the increment and decrement comparators, and wherein the VDAC feedback circuitry further comprises:
    a capacitor C2 coupled between the output node, and a reference voltage Vref;
    the increment and decrement comparators to generate the increment and decrement signals based on a deviation of a voltage V2 on C2 from Vref; and
    reset circuitry coupled to C2 and responsive to a reset signal from the inc/dec logic to reset V2 to Vref after each increment and decrement signal;
    such that an effective loop filter capacitance of the loop filter circuitry is a multiplication of a capacitance of C2.

5. The circuit of claim 1, wherein the current sense circuitry comprises:
    a current mirror with a mirror input leg including a mirror input node coupled to receive the input loop filter current, and a mirror output leg including a mirror output node to provide the sensed loop filter current, the mirror output node coupled to the VDAC feedback circuitry; and
    a source follower transistor included in the mirror input leg, and controlled by the VDAC circuitry to sense the input loop filter current, which is mirrored as the sensed loop filter current to the mirror output leg based on a pre-defined mirror-ratio.

6. The circuit of claim 5, wherein the VDAC circuitry comprises
    an amplifier to provide a control input to the source follower transistor;
    the amplifier having
        a noninverting input coupled to receive the VDAC feedback voltage, and
        an inverting input coupled to the VCO control voltage;
        such that the VCO control voltage is substantially equal to the VDAC feedback voltage.

7. The circuit of claim 6, wherein the VDAC feedback circuitry further comprises:
a capacitor C2 coupled between the mirror output node, and a reference voltage Vref;
the VDAC feedback circuity to generate the discrete-level VDAC feedback voltage, incremented and decremented based on a deviation of a voltage V2 on C2 from Vref, corresponding to the sensed loop filter current; and
reset circuitry coupled to C2 and responsive to a reset signal from the inc/dec logic to reset V2 to Vref after each increment and decrement of the VDAC feedback voltage;
such that an effective loop filter capacitance of the loop filter circuitry is a multiplication of a capacitance of C2 based on the deviation in V2 and the mirror-ratio.

8. The circuit of claim 1, wherein the loop filter circuitry comprises a charge pump loop filter.

9. A circuit, comprising
a phase detector coupled to receive an input signal at an input frequency and phase, and generate a PD phase detect signal based on a VCO feedback signal;
a VCO (voltage controlled oscillator) responsive to a VCO control voltage to generate a VCO output signal phase aligned with the input signal, the VCO feedback signal corresponding to the VCO output signal; and
loop filter circuitry coupled to receive the PD phase detect signal, and to provide a low-pass filtered VCO control voltage to the VCO, including
current sense circuitry to sense an input loop filter current, and provide a corresponding sensed loop filter current; and
VDAC voltage control circuitry, including
VDAC circuitry including a VDAC (voltage digital-to-analog converter), and
VDAC feedback circuity to generate a discrete-level VDAC feedback voltage that is incremented and decremented based on the sensed loop filter current;
the VDAC circuitry to generate the VCO control voltage based on the VDAC feedback voltage, which is based on the sensed loop filter current.

10. The circuit of claim 9, wherein the VDAC circuitry comprises
an amplifier to provide a control input to the current sense circuitry;
the amplifier having
a noninverting input coupled to receive the VDAC feedback voltage, and
an inverting input coupled to the VCO control voltage;
such that the VCO control voltage is substantially equal to the VDAC feedback voltage.

11. The circuit of claim 10, wherein the VDAC feedback circuitry comprises:
increment and decrement comparators responsive to a voltage based on the sensed loop filter current to respectively generate increment and decrement signals; and
inc/dec logic responsive to the increment and decrement signals to generate the discrete-level VDAC feedback voltage.

12. The circuit of claim 9, wherein the current sense circuitry comprises:
a current mirror with a mirror input leg including a mirror input node coupled to receive the input loop filter current, and a mirror output leg including a mirror output node to provide the sensed loop filter current, the mirror output node coupled to the VDAC feedback circuitry; and
a source follower transistor included in the mirror input leg, and controlled by the VDAC circuitry to sense the input loop filter current, which is mirrored as the sensed loop filter current to the mirror output leg based on a pre-defined mirror-ratio.

13. The circuit of claim 12, wherein the VDAC circuitry comprises
an amplifier to provide a control input to the source follower transistor;
the amplifier having
a noninverting input coupled to receive the VDAC feedback voltage, and
an inverting input coupled to the VCO control voltage;
such that the VCO control voltage is substantially equal to the VDAC feedback voltage.

14. The circuit of claim 13, wherein the VDAC feedback circuitry further comprises:
a capacitor C2 coupled between the mirror output node, and a reference voltage Vref;
the VDAC feedback circuity to generate the discrete-level VDAC feedback voltage, incremented and decremented based on a deviation of a voltage V2 on C2 from Vref, corresponding to the sensed loop filter current; and
reset circuitry coupled to C2 and responsive to a reset signal from the inc/dec logic to reset V2 to Vref after each increment and decrement of the VDAC feedback voltage;
such that an effective loop filter capacitance of the loop filter circuitry is a multiplication of a capacitance of C2 based on the deviation in V2 and the mirror-ratio.

15. The circuit of claim 9, wherein the loop filter circuitry comprises a charge pump loop filter.

16. The circuit of claim 9, wherein the circuit comprise one of a phase-locked loop system, and a clock data recovery system.

17. A method suitable for simulating a loop filter capacitor function in a VCO (voltage controlled oscillator), comprising
sensing an input loop filter current, and providing a corresponding sensed loop filter current; and
providing a VCO control voltage by
generating a discrete-level VDAC feedback voltage that is incremented and decremented based on the sensed loop filter current,
generating a VDAC control voltage using a VDAC (voltage digital to analog converter) based on the discrete-level VDAC feedback voltage,
providing the VDAC control voltage to a non-inverting input to an amplifier, and
generating the VCO control voltage at a loop filter output node coupled to an inverting input to the amplifier, the VCO control voltage based on the VDAC feedback voltage, which is based on the sensed loop filter current.

18. The method of claim circuit of claim 10, wherein the VDAC feedback voltage is generated using:
increment and decrement comparators responsive to a voltage based on the sensed loop filter current to respectively generate increment and decrement signals; and
inc/dec logic responsive to the increment and decrement signals to generate the discrete-level VDAC feedback voltage.

19. The circuit of claim 11, wherein the current sense circuitry outputs the sensed loop filter current at an output node coupled to the increment and decrement comparators, and wherein the VDAC feedback circuitry further comprises:

a capacitor C2 coupled between the output node, and a reference voltage Vref;

the increment and decrement comparators to generate the increment and decrement signals based on a deviation of a voltage V2 on C2 from Vref; and reset circuitry coupled to C2 and responsive to a reset signal from the inc/dec logic to reset V2 to Vref after each increment and decrement signal;

such that an effective loop filter capacitance of the loop filter circuitry is a multiplication of a capacitance of C2.

20. The method of claim 18, wherein the voltage based on the sensed loop filter current is generated using:

a capacitor C2 coupled to receive the sensed loop filter current;

incrementing and decrementing the VDAC feedback voltage based on a deviation of a voltage V2 on C2 from a voltage reference Vref; and resetting the V2 voltage on C2 to Vref after each increment and decrement of the VDAC feedback voltage;

such that an effective loop filter capacitance of the loop filter circuitry is a multiplication of a capacitance of C2.

21. The method of claim 18, where the input loop filter current is sensed using:

a current mirror with a mirror input leg including a mirror input node coupled to receive the input loop filter current, and a mirror output leg including a mirror output node to provide the sensed loop filter current, the mirror output node coupled to the VDAC feedback circuitry; and a source follower transistor included in the mirror input leg, and controlled by the VDAC circuitry to sense the input loop filter current, which is mirrored as the sensed loop filter current to the mirror output leg based on a pre-defined mirror-ratio.

\* \* \* \* \*